United States Patent [19]
Ransijn

[11] Patent Number: 5,014,286
[45] Date of Patent: May 7, 1991

[54] DELAY GENERATOR

[75] Inventor: Johannes G. Ransijn, Wyomissing Hills, Pa.

[73] Assignee: AT&T Bell Laboratories, Murray Hill, N.J.

[21] Appl. No.: 419,427

[22] Filed: Oct. 10, 1989

[51] Int. Cl.$^5$ ............................................. H03H 5/159
[52] U.S. Cl. ................................. 375/110; 324/642; 328/56; 307/601; 307/606
[58] Field of Search ................... 375/87, 110, 68; 328/55, 56, 63, 66, 67; 307/597, 601, 605, 606; 324/58 B; 333/20; 455/609

[56] References Cited

U.S. PATENT DOCUMENTS

| | | | |
|---|---|---|---|
| 2,442,614 | 6/1948 | Norton | 375/68 |
| 3,764,830 | 10/1973 | Blore et al. | 333/20 |
| 3,997,843 | 12/1976 | Wohlers | 375/68 |
| 4,247,817 | 1/1981 | Heller | 328/56 |
| 4,257,125 | 3/1981 | Theall | 375/87 |
| 4,257,126 | 3/1981 | Theall | 375/87 |
| 4,354,168 | 10/1982 | Fay | 333/20 |
| 4,355,423 | 10/1982 | Theall | 375/87 |
| 4,561,119 | 12/1985 | Epworth | 455/609 |
| 4,813,057 | 3/1989 | Fullerton | 375/37 |
| 4,833,680 | 5/1989 | Kaiser et al. | 455/609 |

OTHER PUBLICATIONS

*Optical Wideband Transmission Systems*, Clemens Baack, Dr.-Ing., 1986 by CRC Press, Inc., pp. 155-158.
"Digital Communications by Satellite", J. J. Spilker, Jr. Ph.D., 1977 by Prentice Hall, Inc., Englewood Cliffs, N.J.; pp. 431, 432, 434-437.

Primary Examiner—Benedict V. Safourek
Assistant Examiner—Young Tse
Attorney, Agent, or Firm—Scott W. McLellan

[57] ABSTRACT

A delay generator having very high accuracy and stability over temperature variations and time, suited for very short delay times, such as in clock recovery circuits in very high-speed digital data transmission systems. A delay line, having one end either open or shorted and a round-trip delay time of $\tau$, is driven by a voltage source, the output impedance thereof matched to the delay line, and a current source. The current source and the voltage source are driven by an input signal to be delayed. The voltage source is provided by a transistor operating as a voltage follower, which also operates to provide as an output a signal dependent on the difference between the input signal and the voltage on the delay line. This output serves as the output of the delay generator, the input signal delayed by a the time $\tau$.

17 Claims, 5 Drawing Sheets

DELAY GENERATOR

BACKGROUND OF THE INVENTION

1. Field of the Invention

This invention relates to delay generators generally, and more particularly, to delay generators used in clock recovery circuitry of data communication receivers, such as high-speed optical data links.

2. Description of the Prior Art

Most data communication systems require the synchronization of a local sampling clock to an incoming digital data stream to optimally sample the incoming data stream and control the decoding thereof. Typically, the synchronization must extract the local sampling clock from the incoming digital data itself. With many very high-speed systems, the synchronizing process is complicated by the data format of the digital data stream having relatively few data transitions from which a local clock can be derived, e.g., non-return-to-zero (NRZ) coding. The NRZ format allows for a relatively large amount of data which may be transmitted within a given bandwidth, the bandwidth being dictated by regulation or tariff, transmission media capacity, or the capacity of the electronics coupling to the transmission media.

At very high speeds (e.g., $10^9$–$10^{10}$ bits per second, referred to here as 1–10 Giga-bits per second, or Gbs), the traditional methods of deriving the local clock are not sufficient, because of many factors, such as, delay stability with time and temperature, cost, delay symmetry, or physical size. For example, as shown in FIG. 14, page 157, of *Optical Wideband Transmission Systems* by Clemens Baack, Dr.-Ing., 1986, the matched filter/threshold comparator/differentiator/fullwave rectifier arrangement for clock recovery suffers from considerable phase jitter and is difficult to implement in integrated form for the 1–10 Gbs range. The matched filter/square law/high-pass filter arrangement in FIG. 15, also on page 157 of the above-identified reference, is difficult to implement in integrated form for the 1–10 Gbs range due to the strict requirements for the square law function. In addition, the high-pass filter would be composed of a surface acoustic-wave device (SAW) at high bit rates, such as above 1 Gbs, and is not integratable with the other circuitry. However, at very high bit rates, such as at 10 Gbs, the SAW device would not be practical or cost effective to manufacture. At these very high bit rates, the delay-and-multiply technique shown in FIG. 14-1(b) of *Digital Communications by Satellite* by J. J. Spilker, Jr., 1977, may be practical so long as the delay generator can provide a stable delay (of one-half the bit period) over temperature and aging. Preferably, the delay generator should be monolithically integratable with the other electronics of the receiver, unlike the SAW device which cannot be integrated therewith. It is therefore desirable to provide a delay generator which is readily integratable with other electronic circuits used for a receiving system.

It is further desirable to provide such a delay generator that is both relatively inexpensive to manufacture and have reasonably stable delays with temperature and aging. Further, such a delay generator should be adaptable to operate over a relatively wide range of delays. In particular, the delay generator should be able to provide the relatively very short delays necessary for very high-speed digital communication systems, such as high-speed optical data links and the like.

SUMMARY OF THE INVENTION

These and other aspects of the invention are provided for generally by, according to one aspect of the invention, a delay generator being characterized by: a delay line having a characteristic impedance of $Z_0$, a first end terminated in an impedance different from $Z_0$ and round-trip delay time $\tau$; means, responsive to an input signal and connected to the second end of the delay line, for impressing thereon an instantaneous voltage substantially equal to the voltage of the input signal; and differencing means, responsive to the input signal and coupled to the second end of the delay line, for generating the difference between the voltage of the input signal from the voltage across the delay line. The output impendance of the impressing means, combined with the input impedance of the differencing means, is substantially equal to the characteristic impedance of the delay line, and the output of the differencing means is the intput signal delay by the round-trip delay time of the delay line, $\tau$.

Another aspect of the invention is a clock recovery system used in optical data links or the like. The system has a delay generator, responsive to an input signal, for delaying the input signal by substantially one-half the symbol interval of the input signal; a multiplier, responsive to an input signal and the delayed input signal from the delay generator, having an output; and, a filtering means, coupled to the output of the multipler, to pass signals from the multipler, that have a frequency substantially equal to the symbol rate of the input signal, to an output; the delay generator being characterized by: a delay line having a characteristic impedance $Z_0$, a first end terminated in an impedance different from $Z_0$, and round-trip delay time of substantially one-half the symbol interval of the input signal; means, responsive to an input signal and connected to the second end of the delay line, for impressing thereon an instantaneous voltage substantially equal to the voltage of the input signal; and a differencing means, responsive to the input signal and connected to the second end of the delay line, for generating the difference between the voltage of the input signal and the voltage across the delay line. The output impedance of the impressing means, combined with the input impedance of the differencing means, is substantially equal to the characteristic impedance of the delay line, and the output of the differencing means is the output of the delay generator.

According to yet another aspect of the invention, a method of delaying an input signal is characterized by the steps of: impressing across the input of a delay line, of predetermined length and terminated at the end thereof by an impedance different from the characteristic impedance thereof, a signal substantially equal to the input signal; and taking the difference between the input signal the signal across the input of the delay line, the result thereof being the delayed version of the input signal. The amount of delay is substantially determined by the round-trip delay time of the delay line and the delay line is terminated at its input with an impedance substantially equal to the characteristic impedance of the delay line.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
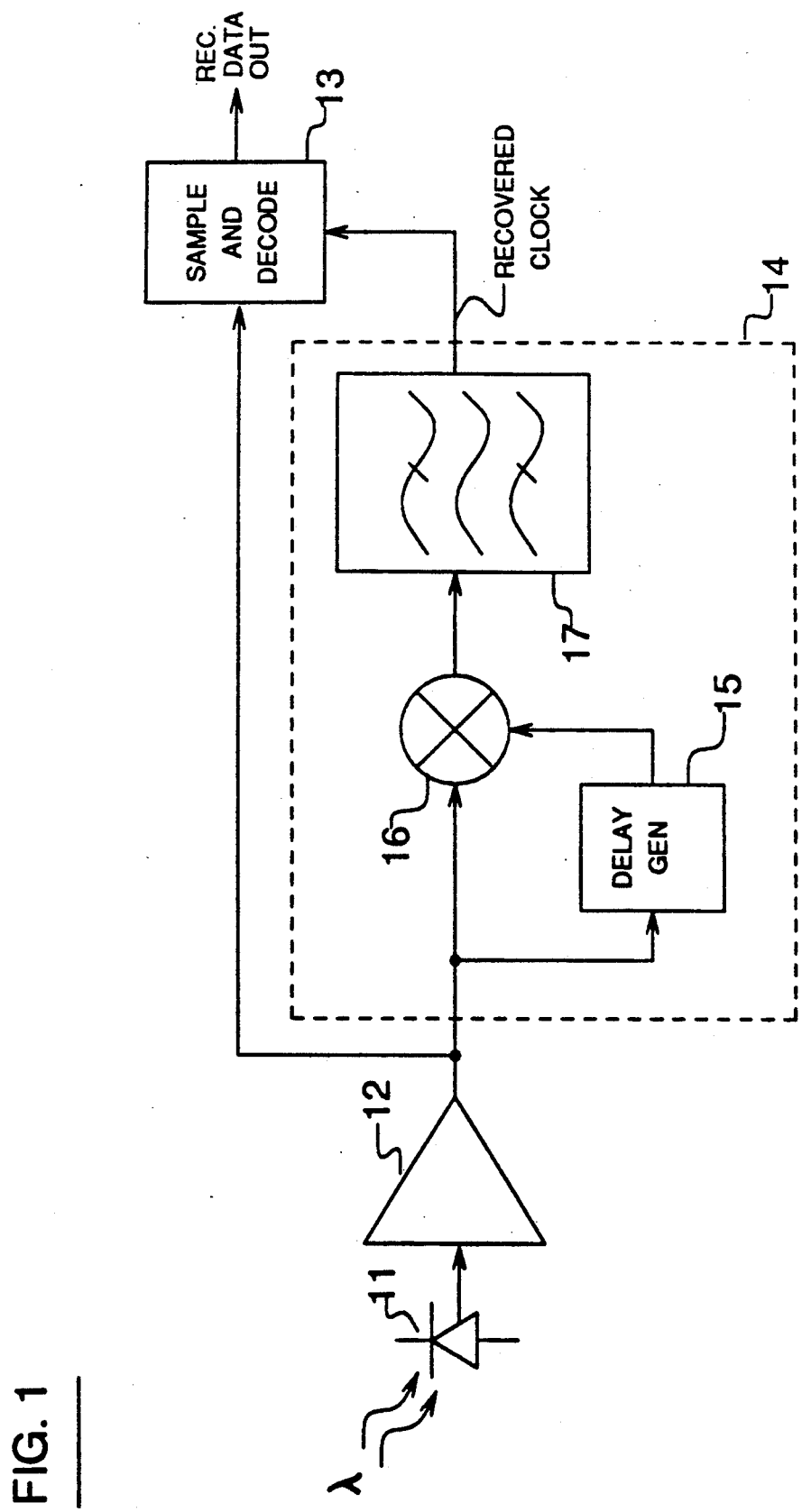
FIG. 1 is a block diagram of the receiver portion of an exemplary high-speed optical data link.

In FIG. 1, an exemplary receiver portion 10 of an high-speed optical data link (not shown) is diagramed. A photodiode 11 converts received optical pulse and converts them to electrical signals which are amplified by amplifier 12. The amplified pulses are coupled to a conventional sample and decode circuit 13 and to a clock recovery circuit 14. A local clock signal is derived by the clock recovery circuitry 14 so that the incoming data is correctly (optimally) sampled and decoded as valid received data.

The clock recovery circuitry 14 is shown here using a delay-and-multiply technique, discussed above. As shown, a delay generator 15, which will be discussed in detail below, delays the amplified pulses from the amplifier 12 by an amount substantially equal to one-half the symbol rate of the received data. Multiplier 16 multiples the amplified pulses with the delayed amplified pulses, the results of which are passed to a filter means 17, shown here as a bandpass filter with a center frequency of substantially the symbol rate of the incoming data. Although shown here as a bandpass filter, filter means 17 may be implemented as a phase-locked loop (PLL).

Figure 2:
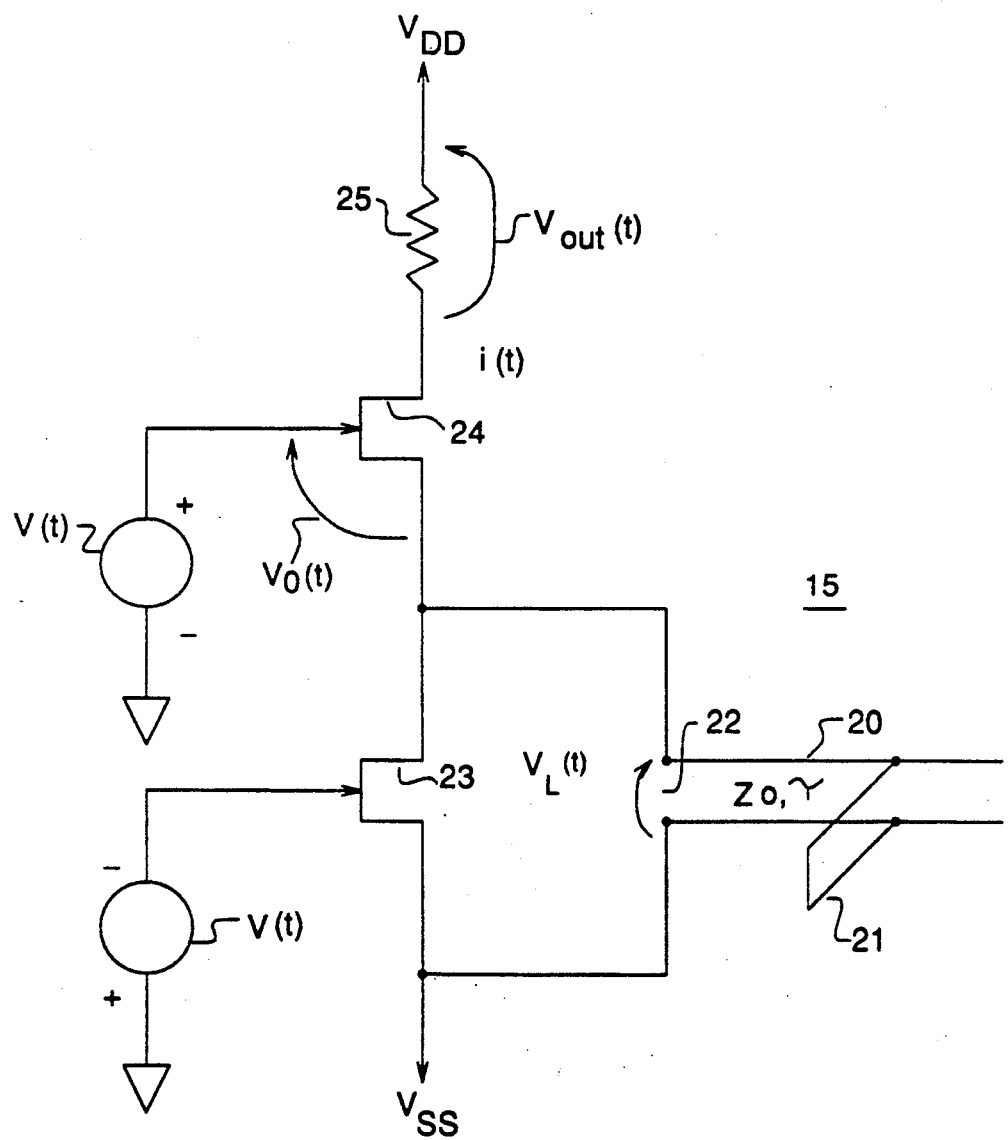
FIG. 2 is a simplified schematic of an exemplary delay generator used in FIG. 1.

The delay generator 15 may be implemented by the circuit shown in FIG. 2. A delay line 20, having a characteristic (or surge) impedance $Z_0$, is terminated at one end with an impedance different from $Z_0$, preferably a shorting stub 21 or an open circuit. The improper end termination allows for a round-trip propagation delay of a signal applied to the input 22 of the delay line 20 of $\tau$ seconds, referred to here as just $\tau$. A means, comprising transistors 23 and 24, impress across the inputs 22 an instantaneous voltage substantially equal to the input signal voltage v(t). Transistor 24 also operates as a differencing means to determine the difference in voltage between the voltage of the input signal v(t) and the voltage $V_L(t)$ across the input 22 of the delay line 20. For purposes here, transistor 24, operating as a voltage (source) follower, in conjunction with transistor 23 operating as a controlled current source, forces $V_L(t)$ to be substantially equal to the instantaneous voltage of the input voltage v(t). By instantaneous voltages, we mean the voltage impressed on the delay line before the so-impressed voltage (signal) has propagated down the delay line 20, reflected off the open end of the delay line 20 or the shorting stub 21, and propagated back through the delay line 20 to input 22. It is understood, as will be shown below, that when the signal has so reflected and returned to the input 22, the voltage thereon will be substantially canceled.

The transconductance ($g_{m24}$) of transistor 24 is chosen such that the output impedance of the transistor 24, as viewed at the source terminal thereof and in parallel with the output resistance of the transistor 23, is substantially equally to the characteristic impedance of the delay line 20. This properly terminates the delay line 20 and absorbs the reflected signals therefrom, as will be explaied in more detail below.

The drain terminal of transistor 24 couples to a load resistor 25 having a resistance of $R_{25}$. The voltage drop thereon, $V_{out}(t)$, is the delayed input signal v(t), which can be represented as $Kv(t-\tau)$. The constant K is determined by the drain current i(t) from transistor 24, the resistance $R_{25}$, the transconductance $g_{m24}$, and the input signal v(t), as will be shown below.

Figure 3:
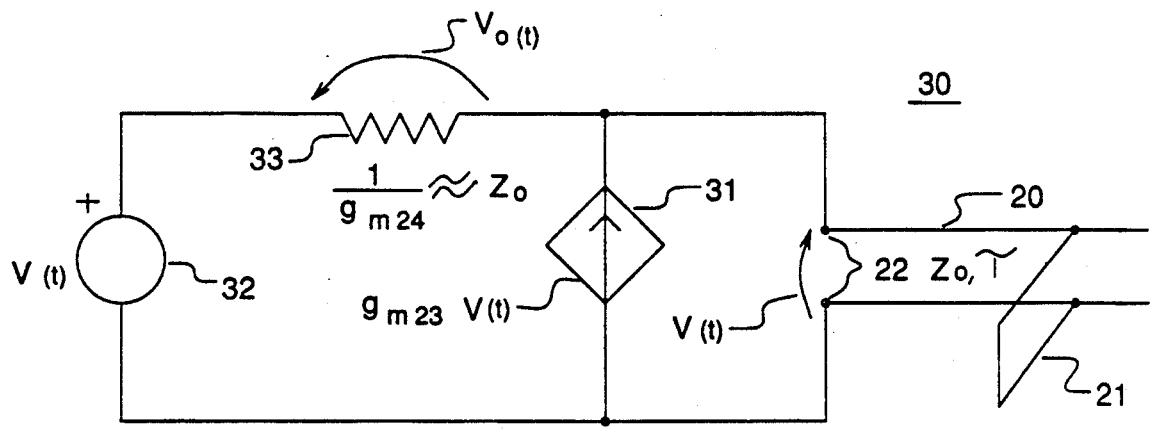
FIGS. 3 and 4 are models of the circuit shown in FIG. 2 to facilitate understanding to the invention.

To understand the operation of the delay generator 15, an electrical model 30 thereof is shown in FIG. 3, using the shorting stub 21. Using an open delay line 20 will be discussed below. Controlled current source 31, corresponding to transistor 23, has a current proportional to the input v(t), shown here as $g_{m23}v(t)$. Transistor 24 (FIG. 1) is modeled as a voltage source 32 and resistor 33, the resistance being substantially $1/g_{m24}$, or as stated above, the characteristic impedance of the delay line 20, ignoring any output impedance of transistor 23 (FIG. 2). The resulting voltage across the delay line 20 inputs 22 is $V_L(t)$.

Figure 4:
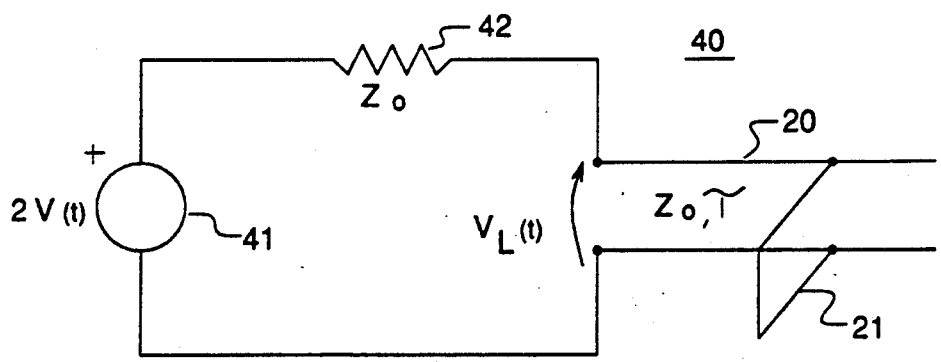
Figure 5:
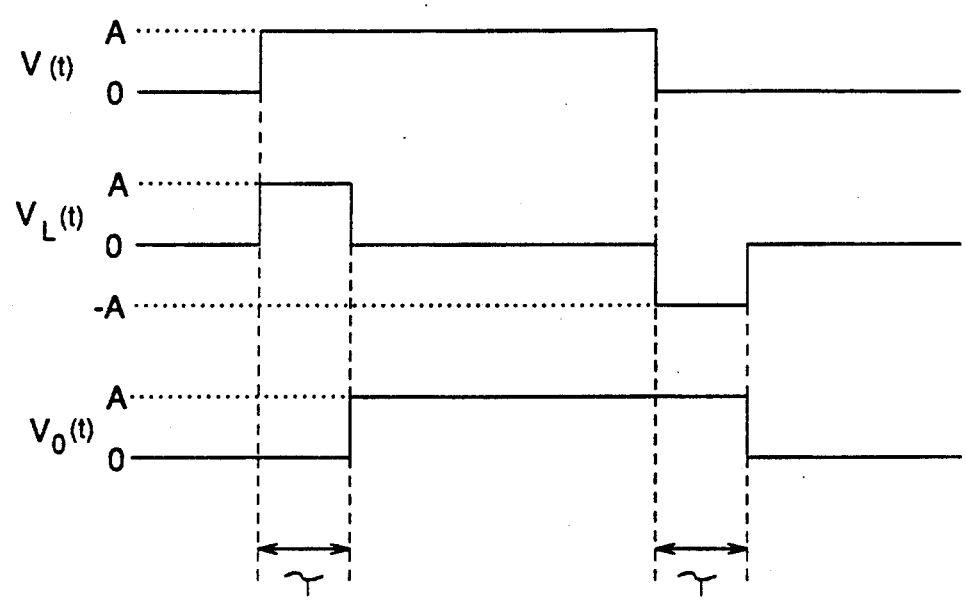
FIG. 5 is an exemplary graph (not to scale) of signals in the exemplary delay generator with a short-circuit termination.

If the transconductances $g_{m24}$ and $g_{m24}$ are substantially the same, it can be shown that the circuit model 30 may be simplified to what is shown in FIG. 4 to determine the voltage $V_L(t)$. In this case, the model 30 (FIG. 3) becomes the model 40 with a voltage source 41 having a voltage twice that of source 32 in FIG. 3. Resistor 42 has the same resistance as resistor 33 in FIG. 3 (substantially $Z_0$). For purposes here, the input signal, v(t), is a pulse having a duration longer than the round-trip delay of the delay line 20, $\tau$. The resulting voltage $V_L(t)$ is graphed in FIG. 5 (not to scale). The resulting voltage $V_L(t)$ is a pulse having an amplitude of A and a period of substantially $\tau$, the round-trip delay time of the delay line 20. The polarity of the pulse is dependent on the polarity of the input signal, v(t); when v(t) goes positive, $V_L(t)$ is a positive pulse of amplitude A and when v(t) goes negative, $V_L(t)$ is a negative pulse of amplitude A. It should be noted that the amplitude of $V_L(t)$ is substantially equally to the amplitude of the input signal v(t).

Returning to FIG. 3, the voltage $V_O(t)$ can be determined as the voltage drop across the resistor 33. The voltage $V_O(t)$ is then $v(t)-V_L(t)$. Referring again to FIG. 5, the voltage $V_O(t)$ can be graphically determined from v(t) and $V_L(t)$ as determined above. As shown, $V_O(t)$ is the intput signal v(t) delay by the time $\tau$. Hence, the input signal v(t) is delayed by the round-trip delay time through the delay line 20, $\tau$.

Figure 6:
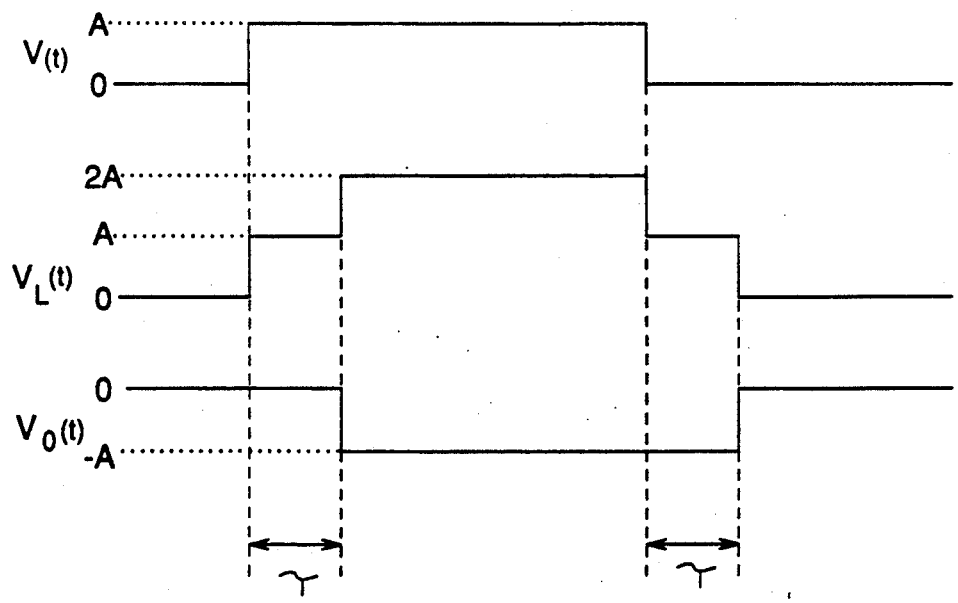
FIG. 6 is an exemplary graph (not to scale) of signals in the exemplary delay generator with an open circuit termination.

Similarly, when shorting stub 21 (FIGS. 3 and 4) is not used (delay line 20 is open-circuited), the resulting voltage $V_L(t)$ is shown in FIG. 6 (not to scale). The voltage $V_L(t)$ is a double pulse of amplitudes A and 2A, the length of the amplitude A portion being substantially $\tau$. As before, if the signal $V_L(t)$ is substracted from the input signal v(t), then $V_O(t)$ is a negative going pulse of amplitude A. As shown, this is the input signal v(t), inverted, and delayed by $\tau$. Hence, the input signal v(t) is delayed by the round-trip delay time through the delay line 20, $\tau$, and inverted.

As stated above, the transconductances $g_{m23}$, $g_{m24}$ should be substantially equal so that the amplitude of $V_L(t)$ is substantially equal to that of v(t). However, transistor 24, operating as a source (voltage) follower may not provide a voltage substantially equal to v(t) as shown by voltage source 32 in FIG. 3. Since the transconductance $g_{m24}$ is primarily used to determine the output impedance of transistor 24, the transconductance $g_{m23}$ may be varied to compensate for inaccuracies of the source follower function of transistor 24.

The voltage $v_o(t)$ is impressed across the gate and source of transistor 24 in FIG. 2. This voltage, $v_o(t)$, multiplied by the transconductance of the transistor 24, $g_{m24}$, is the output current i(t). This current multiplied by the resistance of resistor 25, $R_{25}$, is then the output signal $v_{out}(t)$, which is delayed by $\tau$ and proportional to the input signal v(t):

$$v_{out}(t) \approx R_{25}g_{m24}v(t-\tau) \approx Kv(t-\tau)$$

Figure 7:
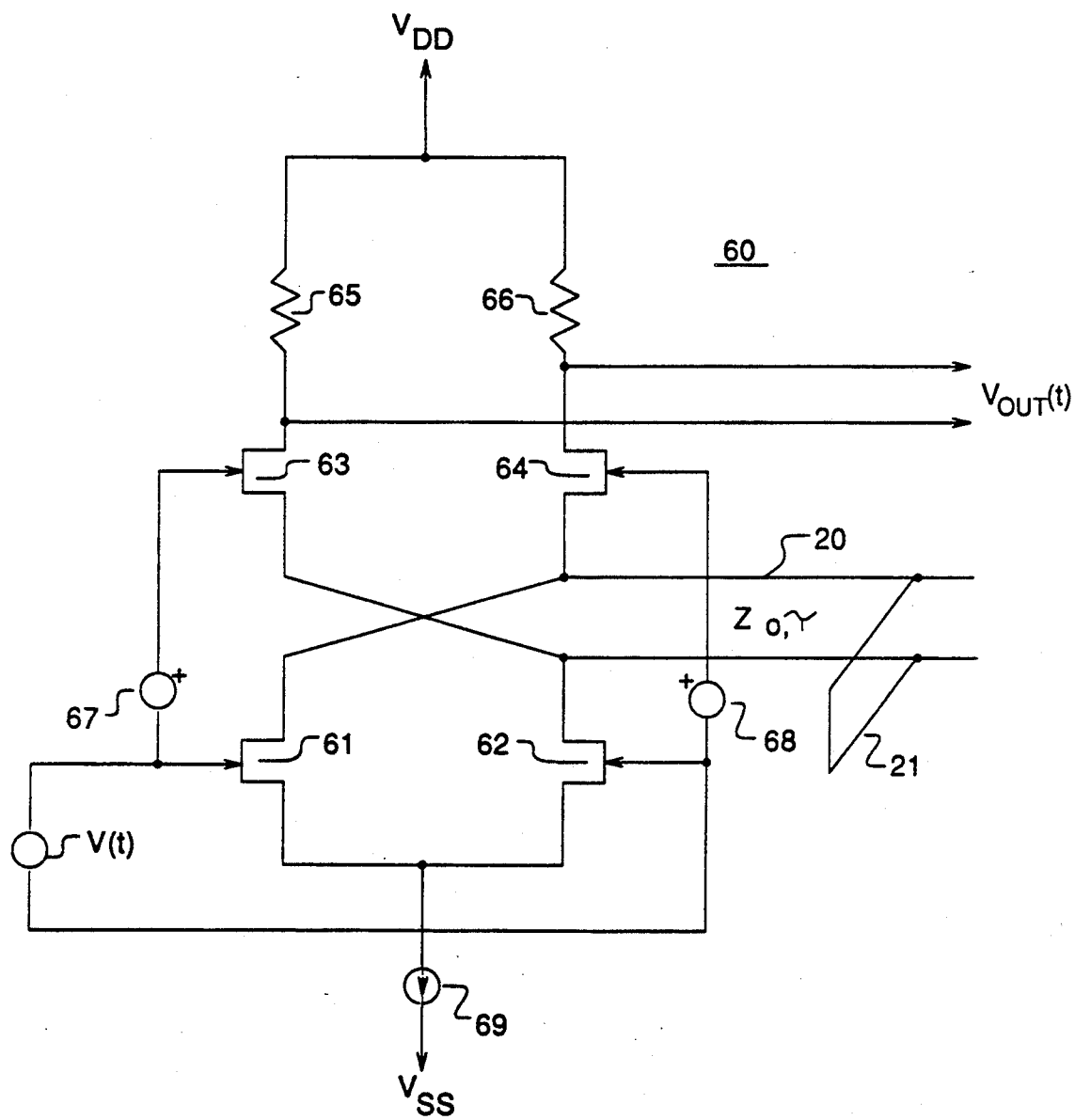
FIG. 7 is a simplified schematic of another exemplary delay generator, similar to that shown in FIG. 2 but for differential operation.

In FIG. 2, the input signal to transistor 24 is v(t) and $-v(t)$ to transistor 23, which may be inconvenient to generate with precise alignment, i.e., the phases are substantially 180° out of phase. Hence, it is preferred that the delay generator be a fully differential implementation of the delay generator 15. One such exemplary implementation is shown in FIG. 7.

Operation of the differential delay generator 60 is similar to that discussed in connection with the operation of the delay generator 15 of FIG. 2. As shown, v(t) is not referenced to a fixed potential and is a fully differential signal. Similarly, the output signal, $v_{out}(t)$ is fully differential. Transistors 61, 62 operate as current sources, corresponding to transistor 23 of FIG. 2. Transistors 63, 64 operate as voltage followers, load impedances to delay line 20, and differencing means, corresponding to transistor 24 of FIG. 2. Also resistors 65, 66 correspond to resistor 25 to FIG. 2. It is noted that transistor 61 is cross-coupled to transistor 64, as are transistors 62 and 63, such that the proper phase of the input signal v(t) is provided to the voltage follower transistors 63, 64 and to the current source transistors 61, 62 for proper operation of the delay generator 60. Level shifting circuitry 67, 68, shown here as fixed voltage sources, provide the proper DC offset necessary for the input signal v(t) to drive both the current source transistors 61, 62 and the voltage follower transistors 63, 64. Current source 69 allows for the common mode voltage of the input signal v(t) to vary without affecting the operation of the delay generator 60. It is further noted that the output impedances of the transistors 63, 64 are effectively placed in series, so that the output impedances thereof must be adjusted lower, each approximately one-half the characteristic impedance, $Z_O$, of the delay line 20.

If, instead of shorting the delay line 20 with stub 21, the delay line 20 is open-circuited, delay generator 60 will provide the desired delay $\tau$ (when delay line 20 is sized to provide the desired delay $\tau$) but the output signal $V_{out}(t)$ will have the opposite polarity to that provided when using the shorted delay line 20.

Although the operation of the delay generator (15, FIG. 2. or 60, FIG. 7) is described above using either a shorted- or an open-circuited delay line 20, other terminations are possible. It is understood that terminating the end of the delay line 20 with an impedance different from the characteristic impedance thereof will allow for the necessary signal reflection by the delay line 20. It is preferable to use an open- or a short-circuited delay line 20 a maximize the amplitude of the reflected signals therefrom. Having described the preferred embodiments of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

I claim:

1. A delay generator characterized by:
   a delay line having a characteristic impedance $Z_O$, a first end terminated in an impedance different from $Z_O$, and round-trip delay time $\tau$;

means, responsive to an input signal and connected to the second end of the delay line, for impressing thereon an instantaneous voltage substantially equal to the voltage of the input signal; and, differencing means, responsive to the input signal and coupled to the second end of the delay line, for generating the difference between the voltage of the input signal and the voltage across the delay line;

wherein the output impedance of the impressing means, combined with the input impedance of the differencing means, is substantially equal to the characteristic impedance of the delay line, and the output of the differencing means is the input signal delayed by the round-trip delay time of the delay line, $\tau$.

2. The delay generator as recited in claim 1, wherein the impressing means is characterized by:
   a voltage source, responsive to the input signal and having a series impedance substantially equal to the characteristic impedance of the delay line, connected to the second end of the delay line; and, a current source, responsive to the input signal, connected to the second end of the delay line;

wherein voltage from the voltage source is combined with the current from the current source to provide an instantaneous voltage across the second end of the delay line substantially equal to the voltage of the input signal.

3. The delay generator as recited in claim 2, wherein the voltage source and the differencing means are characterized by:
   a first transistor having an input and first and second outputs, the conductivity of the transistor between the first and second outputs being determined primarily by the difference in voltage between the input and the first output, the input responsive to the input signal, the first output connected to the second end of the delay line; and, a load resistor connected to the second output of the transistor;

wherein the output of the differencing means is the voltage across the load resistor and the transconductance of the first transistor is chosen such that the impedance provided at the first output of the first transistor is substantially equal to the characteristic impedance of the delay line.

4. The delay generator as recited in claim 3, wherein the current source is characterized by:
   a second transistor having an input and two outputs, the input responsive to the input signal, and the outputs connected to the second end of the delay line;

wherein the transconductance of the second transistor is substantially equal to the transconductance of the first transistor.

5. The delay generator as recited in claim 4, wherein the termination impedance of the delay line is an open circuit.

6. The delay generator as recited in claim 4, wherein the termination impedance is a short circuit.

7. The delay generator as recited in claim 4, wherein the first and second transistors are gallium-arsenide FETs.

8. A clock recovery system, used in optical data links or the like, having:
- a delay generator, responsive to an input signal, for delaying the input signal by substantially one-half the symbol interval of the input signal;
- a multiplier, responsive to an input signal and the delay input signal from the delay generator, having an output; and,
- a filtering means, coupled to the output of the multiplier, to pass signals from the multiplier, that have a frequency substantially equal to the symbol rate of the input signal, to an output;

the delay generator being CHARACTERIZED BY:
- a delay line having a characteristic impedance $Z_O$, a first end terminated in an impedance different from $Z_O$, and a round-trip delay time of substantially one-half the symbol interval of the input signal;
- means, responsive to an input signal and connected to the second end of the delay line, for impressing thereon an instantaneous voltage substantially equal to the voltage of the input signal; and,
- a differencing means, responsive to the input signal and connected to the second end of the delay line, for generating the difference between the voltage of the input signal and the voltage across the delay line;

wherein the output impedance of the impressing means, combined with the input impedance of the differencing means, is substantially equal to the characteristic impedance of the delay line, and the output of the differencing means is the output of the delay generator.

9. The clock recovery system as recited in claim 8, wherein the impressing means is characterized by:
- a voltage source, responsive to the input signal and having a series impedance substantially equal to the characteristic impedance of the delay line, connected to the second end of the dely line; and,
- a current source, responsive to the input signal, connected to the second end of the delay line;

wherein voltage from the voltage source is combined with the current from the current source to provide an instantaneous voltage across the second end of the delay line substantially equal to the voltage of the input signal.

10. The clock recovery system as recited in claim 9, wherein the voltage source and the differencing means are characterized by:
- a first transistor having an input and first and second outputs, the conductivity of the transistor between the first and second outputs being determined primarily by the difference in voltage between the input and the first output, the input responsive to the input signal, the first output connected to the second end of the delay line; and,
- a load resistor connected to the second output of the transistor;

wherein the output of the differencing means is the voltage across the load resistor and the transconductance of the first transistor is chosen such that the impedance provided at the first output of the first transistor is substantially equal to the characteristic impedance of the delay line.

11. The clock recovery system as recited in claim 10, wherein the current source is characterized by:
- a second transistor having an input and two outputs, the input responsive to the input signal, and the outputs connected to the second end of the delay line;
- wherein the transconductance of the second transistor is substantially equal to the transconductance of the first transistor.

12. The clock recovery system as recited in claim 11, wherein the termination impedance of the delay line is an open circuit.

13. The clock recovery system as recited in claim 11, wherein the termination impedance of the delay line is a short circuit.

14. The clock recovery system as recited in claim 11, wherein the first and second transistors are gallium-arsenide FETs.

15. A method of delaying an input signal, characterized by the steps of:
- impressing across a first end of a delay line, of predetermined length and terminated at the second end thereof by an impedance different from the characteristic impedance thereof, a signal substantially equal to the input signal; and,
- subtracting the signal across the first end of the delay line from the input signal, the result thereof being the delayed version of the input signal;
- wherein the amount of delay is substantially determined by the round-trip delay time of the delay line and the delay line is terminated at its first end with an impedance substantially equal to the characteristic impedance of the delay line.

16. The method recited in claim 15, wherein the delay line end termination impedance is a short-circuit.

17. The method recited in claim 15, wherein the delay line end termination impedance is an open circuit.

* * * * *